(12) United States Patent
Yamano et al.

(10) Patent No.: US 9,003,105 B2
(45) Date of Patent: Apr. 7, 2015

(54) SEMICONDUCTOR MEMORY DEVICE AND METHOD FOR WRITING THEREIN

(75) Inventors: Ayako Yamano, Kanagawa-ken (JP); Teruo Takagiwa, Kanagawa-ken (JP); Koichi Fukuda, Kanagawa-ken (JP); Hitoshi Shiga, Kanagawa-ken (JP); Osamu Nagao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 312 days.

(21) Appl. No.: 13/603,697

(22) Filed: Sep. 5, 2012

(65) Prior Publication Data

US 2013/0246730 A1 Sep. 19, 2013

(30) Foreign Application Priority Data

Mar. 16, 2012 (JP) .................................. 2012-060828

(51) Int. Cl.
| | |
|---|---|
| *G06F 12/08* | (2006.01) |
| *G06F 12/02* | (2006.01) |
| *G11C 16/00* | (2006.01) |
| *G11C 11/56* | (2006.01) |
| *G11C 16/16* | (2006.01) |

(52) U.S. Cl.
CPC ........ *G06F 12/0891* (2013.01); *G06F 12/0246* (2013.01); *G11C 16/00* (2013.01); *G11C 11/5635* (2013.01); *G11C 16/16* (2013.01); *G06F 2212/7209* (2013.01)

(58) Field of Classification Search
USPC ................................................ 711/103, 166
See application file for complete search history.

(56) References Cited

U.S. PATENT DOCUMENTS

| 2001/0004326 A1* | 6/2001 | Terasaki .................... 365/185.23 |
| 2007/0035997 A1* | 2/2007 | Shibata et al. ........... 365/185.03 |
| 2007/0297236 A1 | 12/2007 | Tokiwa |
| 2010/0161881 A1* | 6/2010 | Nagadomi et al. ............ 711/103 |
| 2013/0145083 A1* | 6/2013 | Suzuki et al. ................. 711/103 |

FOREIGN PATENT DOCUMENTS

| JP | 10-93054 | 4/1998 |
| JP | 10-233096 | 9/1998 |
| JP | 2008-4178 | 1/2008 |

* cited by examiner

*Primary Examiner* — Yong Choe
(74) *Attorney, Agent, or Firm* — Oblon, McClelland, Maier & Neustadt, L.L.P.

(57) ABSTRACT

According to one embodiment, a semiconductor memory device includes a plurality of blocks in a memory cell, each of the blocks acting as an erasure unit of data, the block including a plurality of pages, each of the pages including a plurality of memory cell transistors, each of the memory cell transistors being configured to be an erasure state or a first retention state based on a threshold voltage of the memory cell transistor, and a controller searching data in the block with respect to, writing a first flag denoting effective into a prescribed page of the block with the erasure state, and writing the first flag denoting non-effective into a prescribed page of the block with the first retention state, reading out the prescribed page of the block with the first retention state, and determining that the block is writable when the first flag denotes effective.

20 Claims, 10 Drawing Sheets

SEMICONDUCTOR MEMORY DEVICE AND METHOD FOR WRITING THEREIN

CROSS REFERENCE TO RELATED APPLICATION

This application is based upon and claims the benefit of priority from prior Japanese Patent Application No. 2012-060828, filed on Mar. 16, 2012, the entire contents of which are incorporated herein by reference.

FIELD

Exemplary embodiments described herein generally relate to a semiconductor memory device and a method for writing in the semiconductor memory device.

BACKGROUND

A NAND-type flash memory has been well known. In the NAND-type flash memory, a block with a state of data erasure is searched in a specific timing. An erasure block search is performed before writing data into a memory cell, for example. Further, data is written into the erased block found in the search.

Searching the erased block is generally performed by using reading out in general. Specifically, a top page of each block to be searched is read out, and the searched area is all the blocks for user data in the memory, for example.

When the top page is set to be the erasure state, the block including the page is determined to be the erasure state, for example. Generally, reading out data includes pre-charging all bits in the memory.

On the other hand, a page size is increased with higher integration of the NAND-type flash memory. Increase of the page size leads to increase of a number of the memory cell. Accordingly, a number of the bit lines are also increased.

In such a manner, electrical current in pre-charging the bit lines of reading out data is increased. Therefore, electrical current used in the block search is also increased.

DETAILED DESCRIPTION

Figure 1:
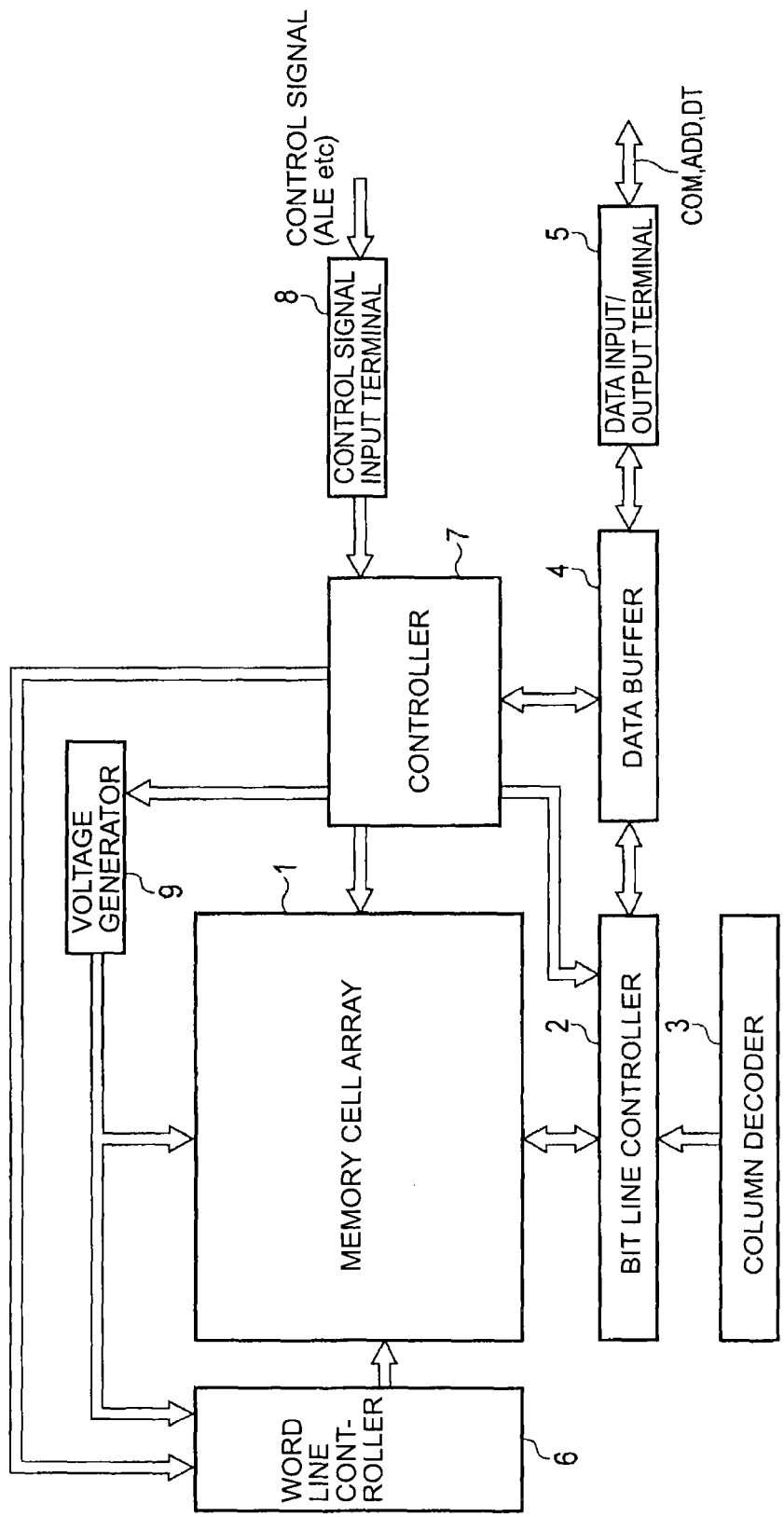
FIG. 1 is a block diagram showing a total constitution of a semiconductor memory device according to a first embodiment.

According to one embodiment, a semiconductor memory device includes a plurality of blocks in a memory cell, each of the blocks acting as an erasure unit of data, the block including a plurality of pages, each of the pages including a plurality of memory cell transistors, each of the memory cell transistors being configured to be an erasure state or a first retention state based on a threshold voltage of the memory cell transistor, and a controller searching data in the block with respect to, writing a first flag denoting effective into a prescribed page of the block with the erasure state, and writing the first flag denoting non-effective into a prescribed page of the block with the first retention state, reading out the prescribed page of the block with the first retention state, and determining that the block is writable when the first flag denotes effective.

According to another embodiment, a writing method in a semiconductor memory device includes receiving a search command in a controller to search a block of an erasure state with respect to data, searching the block of the erasure state by the controller, determining whether or not the block being the erasure state or a first retention state by the controller, writing a first flag denoting effective into a prescribed page of the block with the erasure state by the controller, and writing the first flag denoting non-effective into a prescribed page of the block with the first retention state by the controller, and reading out data by the controller from the block and outputting information in which the block is the erasure state when the block is the erasure state.

Embodiments will be described below in detail with reference to the attached drawings mentioned above. Throughout the attached drawings, similar or same reference numerals show similar, equivalent or same components.

First Embodiment

FIG. 1 is a block diagram showing a total constitution of a semiconductor memory device (NAND-type flash memory) according to a first embodiment. As shown in FIG. 1, a memory includes memory cell array 1, bit line controller 2, a column decoder 3, a data buffer 4, a data input/output terminal 5, a word line controller 6, a controller 7, a control signal input terminal 8, and a voltage generator 9. The memory cell array 1 includes a plurality of blocks. Each of the blocks includes a plurality of memory cells, word lines, bit lines and the like. The block includes a plurality of pages, each of the pages constituted with a plurality of memory cells. The block is explained in detail below. The memory cell array 1 is electrically connected to the bit line controller 2, the word line controller 6, the controller 7, and the voltage generator 9.

The bit line controller 2 detects a state of each of the memory cell in the memory cell array 1 via the bit line to read out data stored in the memory cell. Further, the bit line controller 2 applies a write-in voltage (program voltage) to the memory cell in the memory cell array 1 via the bit line to write data into the memory cell. The bit line is connected to the column decoder 3, the data buffer 4 and the controller 7.

The bit line controller 2 includes a sense amplifier, a data memory circuit (latch) and the like. The column decoder selects a specific data memory circuit. Data read out to the selected memory circuit is outputted out of the memory cell from the data input/output terminal 5 via the buffer 4. The data input/output terminal 5 is connected to a device set out of the memory, a host device, memory controller or the like, for example. The data input/output terminal 5 is received various kinds of commands COM, addresses ADD and data DT controlling memory action, and outputs data DT. Data DT written-in the data input/output terminal is provided into the data memory circuit selected by the column decoder 3 via the data buffer 4. The commands COM and the addresses ADD are provided to the controller 7. A sense amplifier amplifies an electric potential of the bit line.

The word line controller 6 selects a specific word line in the memory cell array 1 according to the controller 7. Further, the word line controller 6 is received a voltage to read out data, write in data or erase data from the voltage generator 9. The word line controller 6 applies these voltages to the selected word line.

The controller 7 is electrically connected to the memory cell array 1, the bit line controller 2, the column decoder 3, the data buffer 4, the word line controller 6, and the voltage generator 9, and controls the units 2, 3, 4, 6, 9. The controller 7 is connected to the control signal input terminal 8, and is controlled by control signals, an address latch enable signal ALE for example, inputted from outer device of the memory via the control signal input terminal 8. Further, the controller 7 controls the voltage generator 9 via the control signal. The voltage generator 9 provides voltages to the memory cell array 1, the word line controller 6 or the like according to the controller 7 in each action of write-in, read-out or erasure.

Figure 2:
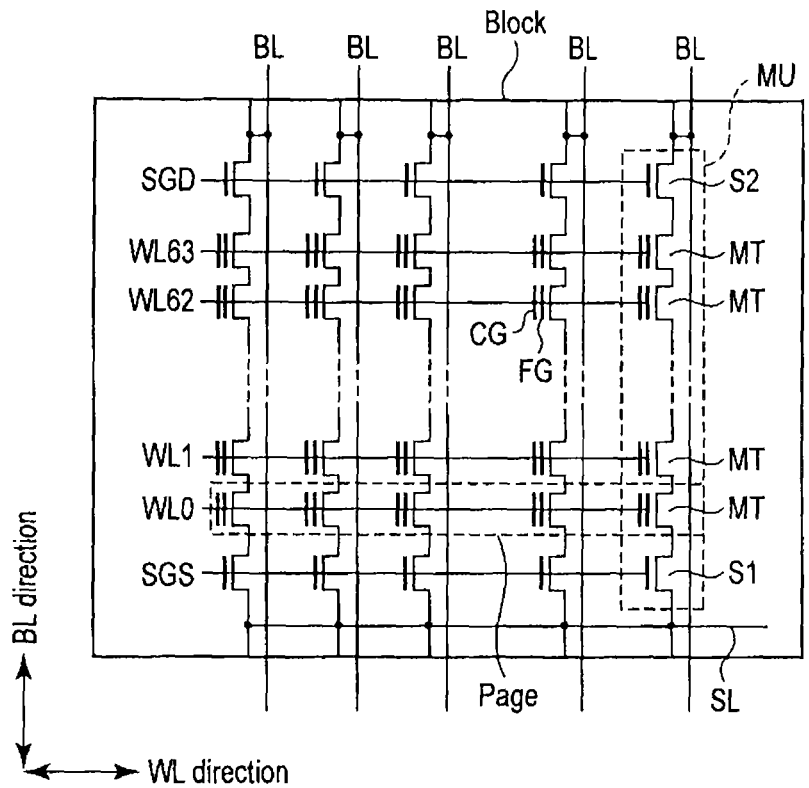
FIG. 2 is a circuit diagram showing a block in a memory cell array of the semiconductor memory device according to the first embodiment.
Figure 3:
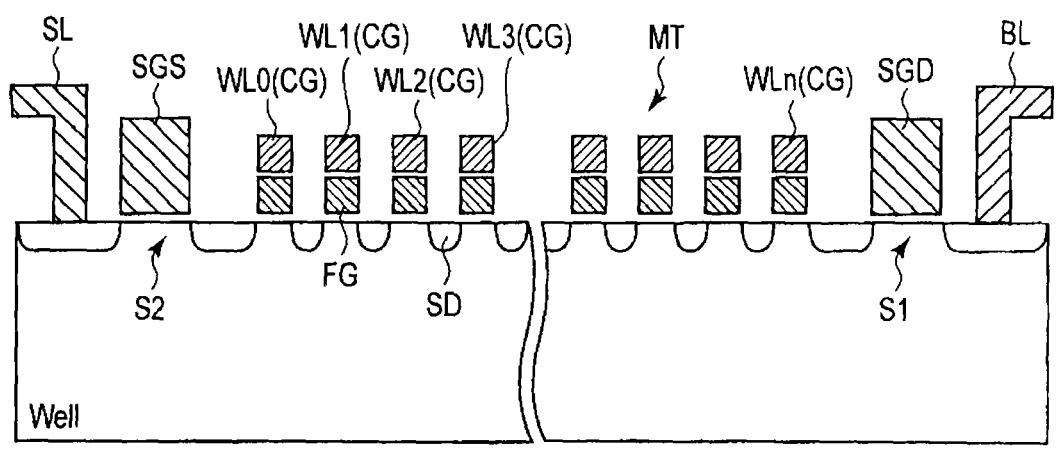
FIG. 3 is a cross sectional view of the block in the memory cell array of the semiconductor memory device according to the first embodiment.

FIGS. 2, 3 are a circuit diagram and a cross sectional view of a block in the memory cell array. As shown in FIGS. 2, 3, the block includes a plurality of memory cell rows (memory cell unit) MU arranged along the word line direction (WL direction). The memory cell unit MU includes a NAND string and selection transistors S1, S2. The NAND string is constituted with a plurality of memory cell transistors MT. The selection transistors S1, S2 are connected to both end of the NAND string, respectively. Each of the memory cell transistors MT and the selection transistors S1, S2 is serially connected with a source/drain SD shared each other in an electrical current pass. The other end of each of the selection transistors S1, S2 in each of the electrical current pass is connected to a source line SL or a bit line BL, respectively. The memory transistor MT in the block is collectively erased. In other word, the block is an erasure unit. The word lines WL0-WL63 extend to the WL direction and are connected to all the memory transistors MT in the same column. The selection gate line SGD extends to the WL direction and connected to all of the selection transistors S2 in the block. The selection gate line SDS extends to the WL direction and connected to all of the selection transistors S1 in the block.

A plurality of memory cell transistors connected to the same word line MT or a memory space constitute a page as a unit. Data is read out or is written in every page. The memory is constituted with a state that one memory cell can have data of plural bits. A memory cell transistor MT retained two bits retains "n m" data where "n" and "m" are zero and/or one. In the data, "n" and "m" represent upper page data and lower page data, respectively. Each of proper physical addresses is allocated to a collection of each lower page data of the memory cell transistors MT connected to the same word line and a collection of each upper page data of the memory cell transistors MT connected to the same word line.

The memory cell transistor MT is positioned at a cross point between the bit line BL and the word line WL. The memory cell transistor MT is provided on a well area in a semiconductor substrate.

The well received various kinds of voltages from the voltage generator 9. The memory cell transistor MT includes a tunnel insulator, a floating gate electrode FG as a charge accumulation layer, a gate insulator (not shown), a control gate electrode CG (word line WL) and a source/drain area SD on the well. Adjacent memory cell transistors MT shares the source/drain area SD each other. Each of the selection transistor S1, S2 includes a gate insulator (not shown), a gate electrodes SGS, SGD and a source/drain area SD on the semiconductor substrate. The memory cell transistor MT has a different threshold value corresponding to a number of electrons accumulated in the floating gate and memorizes data corresponding to the threshold value.

Figure 4:
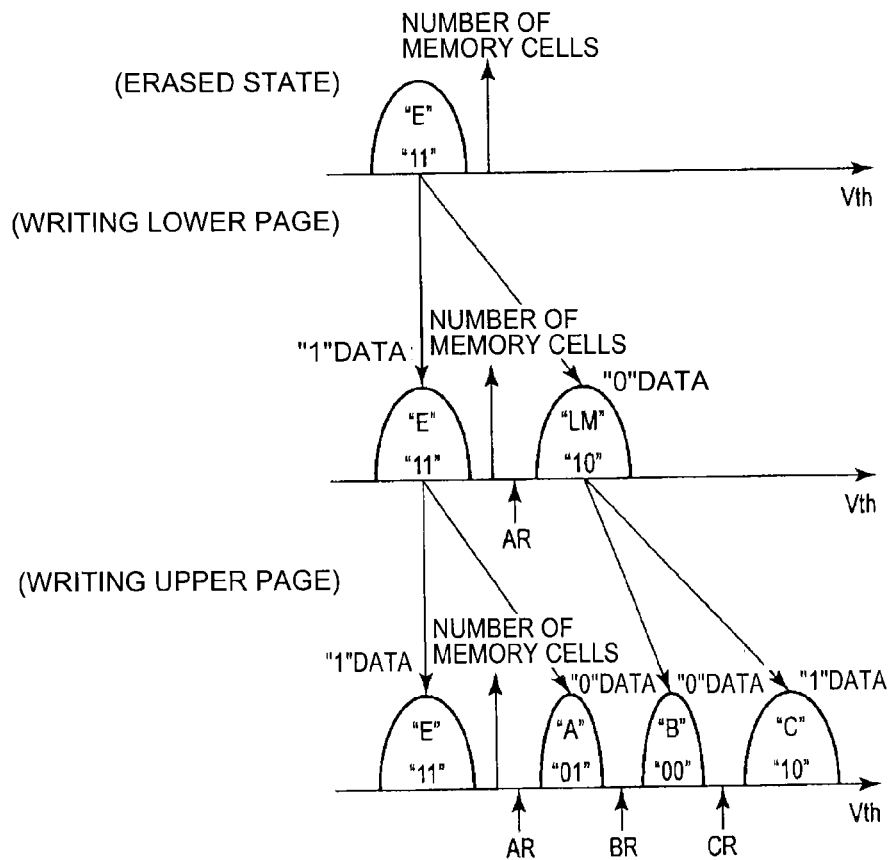
FIG. 4 is a conceptual diagram showing a relationship between data in a memory cell transistor and a distribution of threshold voltages according to the first embodiment.

FIG. 4 is a conceptual diagram showing a relationship between data in the memory cell transistor MT and a distribution of threshold voltages according to the first embodiment. In the figure, four-value NAND-type memory with two bits/cell is demonstrated. Each of the memory cell transistors MT can have one of four threshold voltages. Four threshold voltages are corresponded to "11" data, "01" data, "10" data and "11" data, for example. States of the transistor retaining "11" data, "01" data, "10" data and "11" data are called E state, A state, B state and C state, respectively. It is an example of correspondence between each threshold voltage and each data described above. However, E state is related to an erasure state of the memory cell transistor MT as described below. The threshold voltages practically have inhomogeneity to be demonstrated as a constant distribution as shown in FIG. 4. Each of voltages AR, BC and CR are a voltage applied to the selection word line when reading out data. It is determined whether the memory cell transistor MT is over A state or not by using the voltage AR, for example. For writing in two bits, the memory cell transistor MT is retained as "11" data retention state or transferred to "10" data retention state. In such a manner, the lower page data is written in. A state called LM state in a case that only the lower page data is written in the memory cell transistor MT so as to retain "10" data. In a case that only the lower page is demanded to be written in, writing data into the memory cell transistor MT is completed in this stage. "11" and "10" are corresponded to one bit data of "1" and "0", respectively. Successively, in a case that the upper page also is written in, the memory cell transistor MT with E state ("11" retention state) is retained as E state or is transferred into A state ("01" retention state), and the memory cell transistor MT with LM state is transferred into B state ("00" retention state) or C state ("10" retention state). In such a manner, the upper page data is also written-in.

Figure 5:
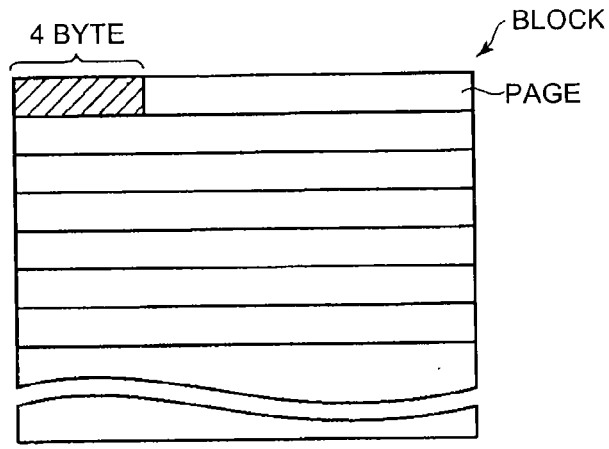
FIG. 5 is a conceptual diagram showing searching an erasure block according to the first embodiment.

FIG. 5 is a conceptual diagram showing an erasure block search according to the first embodiment. As shown in FIG. 5, one block is represented, and each of the blocks includes common bit lines as described above. A number of bit lines BL are corresponded to a number of the memory cell transistors MT in one page. For the erasure block search, the memory reads out data from each specific page, called an inspection page, of the blocks to be searched. The inspection page is typically the top page in each block. Generally, data is written into the block in ascending order from the top page. Therefore, the memory read out from not all data of the inspection page but a portion in which partially continuous data of the memory cell transistor MT. A selection condition of data from the memory cell transistor MT is described below.

In a case that the searched block is the erasure block, all bits of the search page is set to be the erasure state, namely, "11" retention state. On the other hand, when the searched block is the written-in block, the searched page is mixed with "0" or "1". Data is written-in on a basis of various kinds of items in the memory. As a result, continuous bits are read out. A number of the continuous bits is over a number of non-continuous bits of "1" data. Specifically, the number is determined on a basis of items mentioned below. A portion in the memory retains data to be written-in received from an external portion as a re-arranged state. When data is read out, the re-arranged bits are restored to be read out from the memory. The semiconductor memory device according to the first embodiment supports such a random manner. Even when the written-in data includes continuous "1" data, a number of continuous "1" data is restricted to a specific number in data written into the page via the random manner according to the first embodiment. Specifically, the number is restricted to a number determined based on algorithm in the random manner. In the first embodiment, data written-in through the random manner does not include continuous "1" data through four bites (four columns), for example. As a result, continuous bits over thirty-two set in a specific position of the inspection page are read out as shown in FIG. 5. The position of the bits to be read out is set to be a top portion of the inspection page, for example.

The re-arrangement of the bits can be performed by a controller controlling the memory, for example. A memory device including a memory and a controller controlling the memory, or a combination of a memory and a controller controlling the memory, which are not collectively arranged, can be considered as a utilizing aspect, for example. Such a controller connects a memory and a device storing data into the memory and read out data from the memory. When the controller received data to be written-in from the device, the controller re-arranges the bits and provides the re-arranged data written-in to the memory. The first embodiment is also applied to such the aspect.

Figure 6:
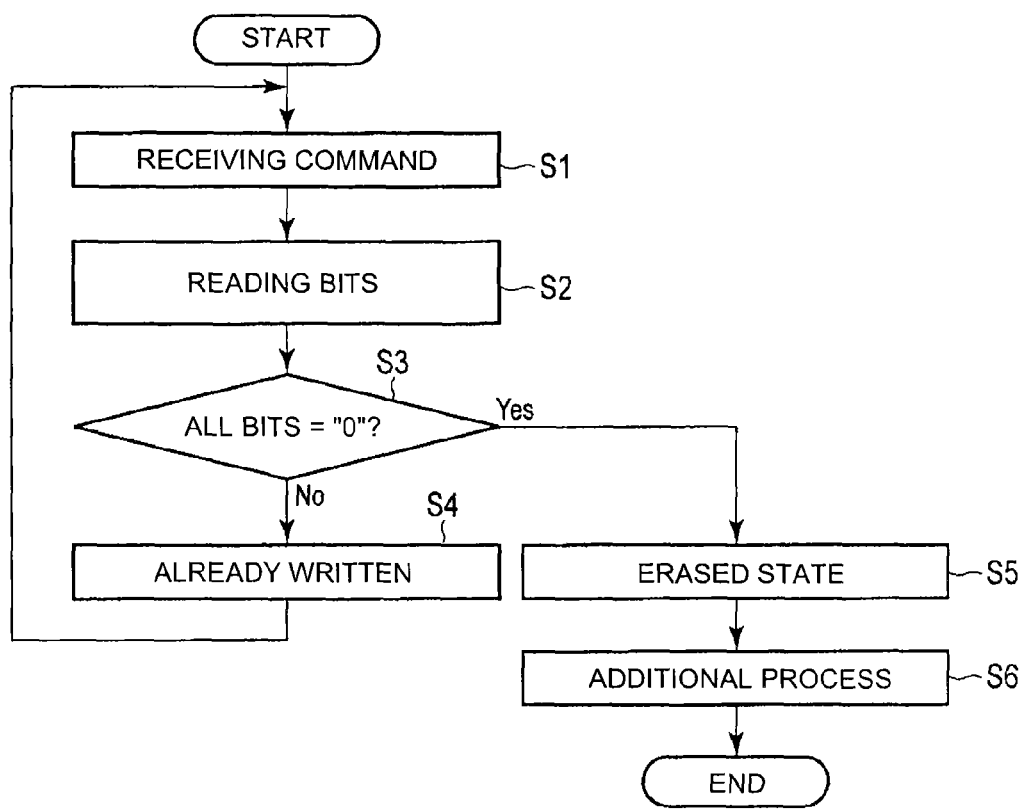
FIG. 6 is flow steps showing searching an erasure block according to the first embodiment.

FIG. 6 is flow steps showing an erasure block search according to the first embodiment. As shown in FIG. 6, the memory is received an erasure block search command (step S1). The erasure block search command is a dedicated command. In an erasure block search using all bits, all the bits are read out, accordingly, a conventional read-out command can be utilized. On the other hand, specific bits only read out are necessary to the erasure block search command. The erasure block search command instructs to read out specific bits in the inspection page to the memory and is outputted from an outer device which desires to the erasure block search. The controller 7 is constituted to enable to recognize the erasure block command and to configure to execute processing demanded from the command. The erasure block search command also specifies an address of the erasure block search command, the block to be searched or the inspection page.

The controller 7 responses to receiving the erasure block search command to pre-charge to only the bit line BL corresponded to the inspection bits which is the bit for search in the block to be searched, so that the controller 7 reads out data (Step S2). Specifically, the controller 7 retains "1" data in a data latch for the bit line BL to be charged of data latches in the bit line controller 2, for example, and retains "0" data in a data latch for the bit line to be not charged. Next, the controller 7 transfers these retention data to each of sense amplifiers in the bit line controller 2, the sense amplifier is corresponded. The sense amplifier is allocated to the corresponded pair of the data latch and the bit line BL. The bit line corresponded to the sense amplifier received "1" data is pre-charged and the bit line corresponded to the sense amplifier received "0" data is not pre-charged.

It is determined whether data read out from the bit line corresponded to the search bit is "1" or "0" by using the same steps and circuit as the conventional data reading, and a threshold value of one bit data for the judge. Specifically, the voltage AR is used. The read-out bits are received with the controller. The controller determines all the received search bits are "1" (erased state) or not (Step S3). When the judge in Step S3 is "No", the block including the page to be searched is a written-in state.

Next, a data bit inspection circuit 21 outputs a response in which the block to be searched by the ensure block search command, is the written-in state to an outer device (Step S4). The outer device provides an ensure block search command to specify next block to the memory when the outer device received the response. The memory repeats Steps S2 and S3 on new block to be searched. On the other hand, when the judge in Step S3 is "Yes", the block to be searched is the erasure state. Next, the memory outputs a response in which the block to be searched by the ensure block search command is the erasure state to the outer device (Step S5). The successive steps are arbitrarily and additionally performed and are different due to the outer device using the memory. The outer device writes data into the erasure block or resisters the erasure block (Step S7).

As described above, specific continuous bits in the search page are read out for the erasure block search according to the first embodiment. Therefore, the same number of the bit lines BL corresponded to the bits read out are pre-charged. Accordingly, electrical current used to pre-charge in this method is less than that used to pre-charge all bit lines in the inspection page. In a case that one page is corresponded to 16K bits, for example, electrical current consumption in pre-charging all bit lines BL is 40 mA, for example. The current amount of the case can read out over 4 bit which is a number of the bit line BL read out in the first embodiment. In this discussion, the consumption current in the first embodiment is reduced to $4/16$K which equal to about $1/4,000$ as compared to the conventional case. Accordingly, the consumption current used in the ensure block search can be decreased.

Figure 7:
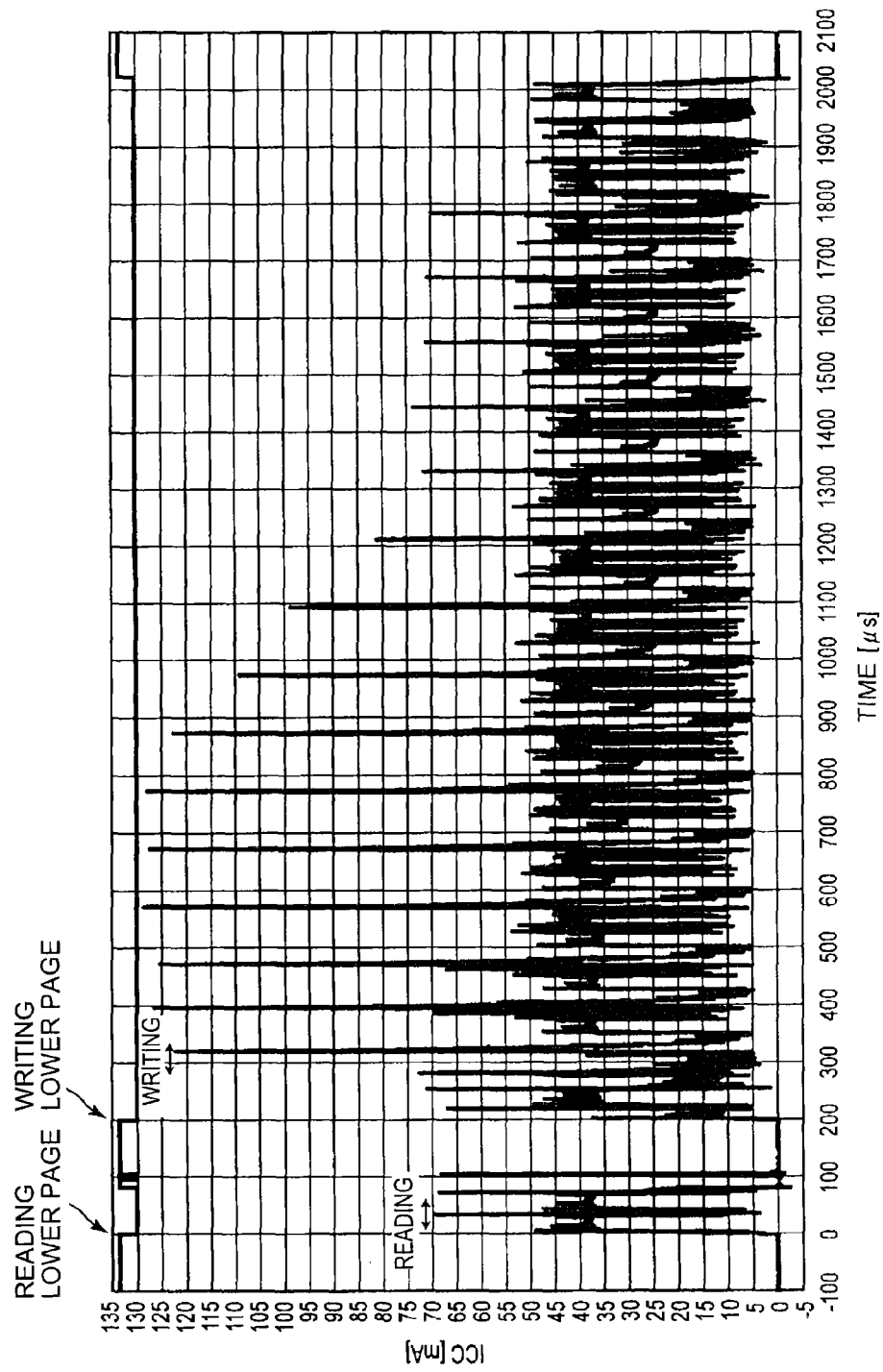
FIG. 7 is a timing chart showing a simulation on consumption current of the semiconductor memory device according to the first embodiment.
Figure 8:
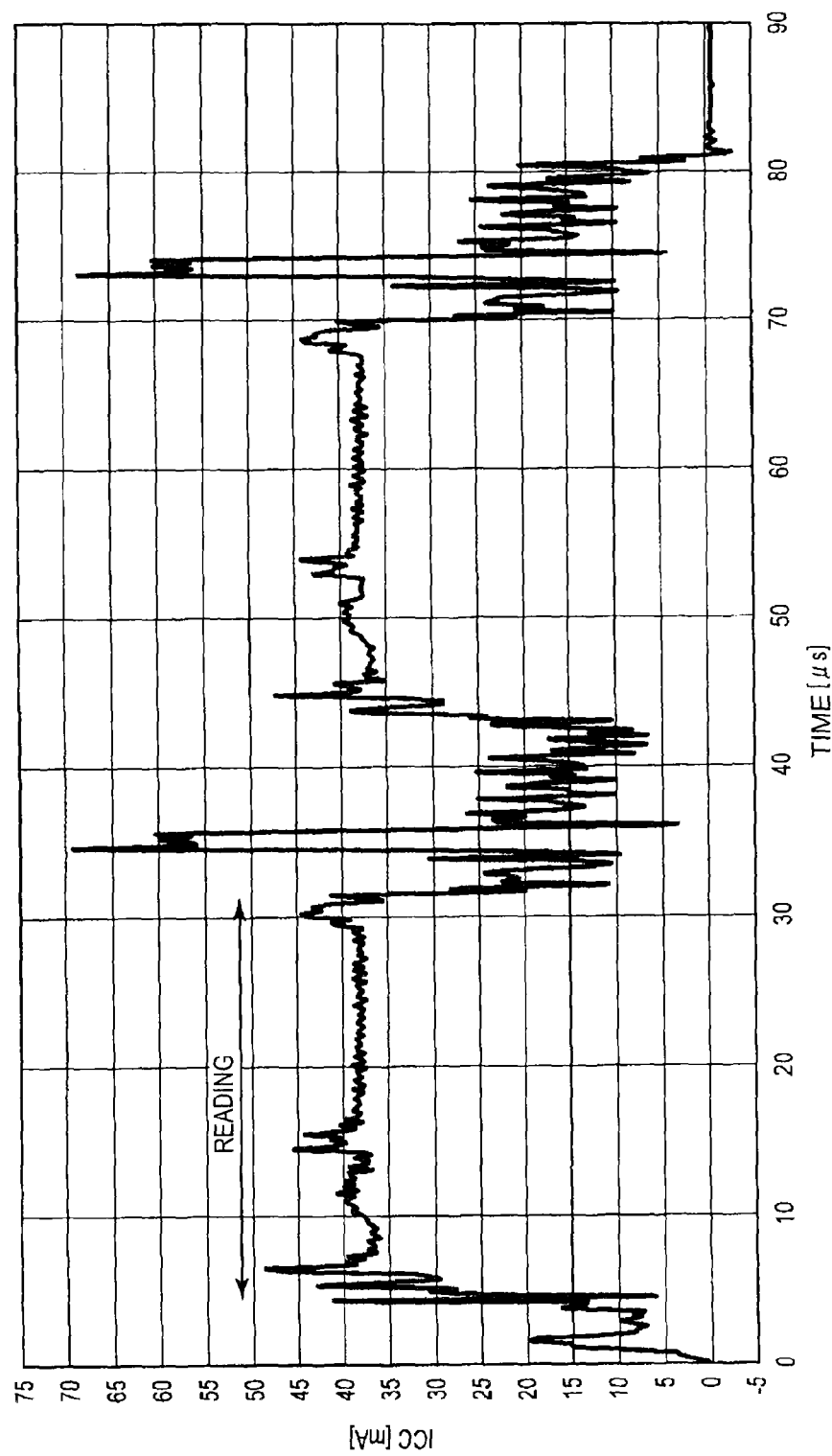
FIG. 8 is a timing chart showing a simulation on consumption current of the semiconductor memory device according to the first embodiment.
Figure 9:
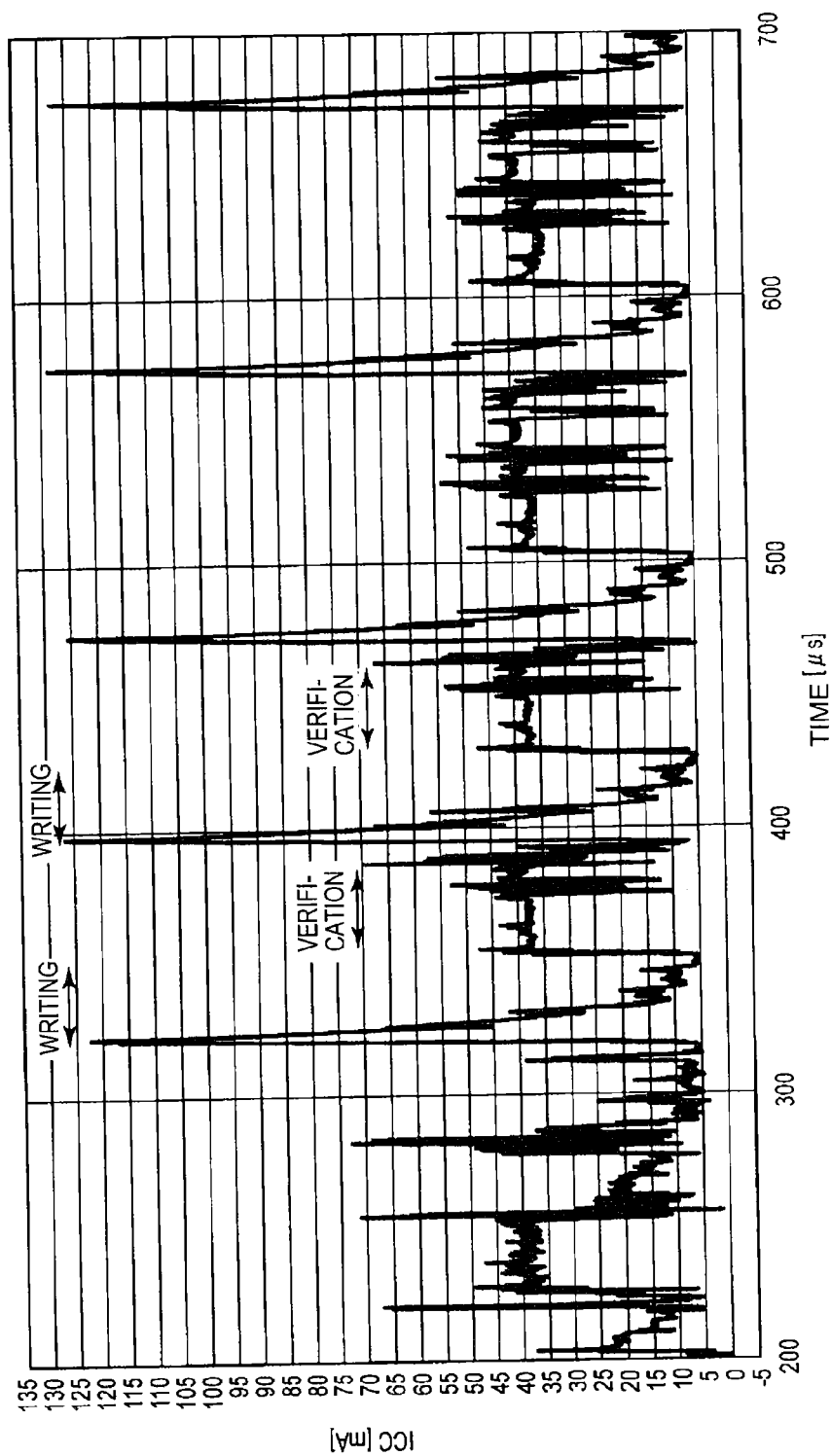
FIG. 9 is a timing chart showing a simulation on consumption current of the semiconductor memory device according to the first embodiment.

FIGS. 7-9 are timing charts showing simulations on consumption current of the semiconductor memory device. FIG. 7 shows a time dependence of the consumption current when an ensure block search and writing data into an ensure block are performed. FIG. 8 is an enlarged diagram in reading time (0-90 μs) and FIG. 9 is an enlarged diagram in writing time (200-700 μs). FIG. 7 shows an example in which all bit lines are pre-charged to perform the ensure block search. As shown in FIG. 7, a peak current about 50 mA is consumed due to pre-charge all bit lines for the ensure block search. On the other hand, the consumption current is decreased by reading out specific bit lines BL according to the first embodiment. The peak current is decreased to $1/4,000$ against a conventional case of 50 mA in a case that over 4 bits of the bit lines, for example.

Second Embodiment

A second embodiment is related to a specific flag of an ensure block search. A functional block of a semiconductor device according to the second embodiment is the same as the first embodiment. On the other hand, actions in some of functional blocks in the second embodiment are different from that in the first embodiment. Memories according to the second embodiment, especially corresponding functional blocks are configured to realize actions described below.

Figure 10:
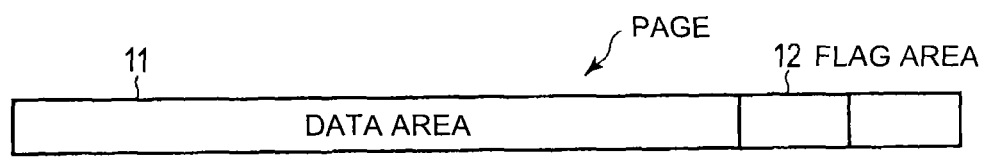
FIG. 10 is a conceptual diagram showing searching an erasure block according to a second embodiment.

FIG. 10 is a conceptual diagram showing searching an erasure block according to the second embodiment. An inspection page, a top page for example, in each of the blocks has a state as shown in FIG. 10, when data is written-in. In other word, the inspection page includes a data area 11 and flag area 12. The data area 11 retains data demanded to be written which is called user data. A position of the flag area can be specified by an address in the data area 11 which is fixed in the page, for example.

Figure 11:
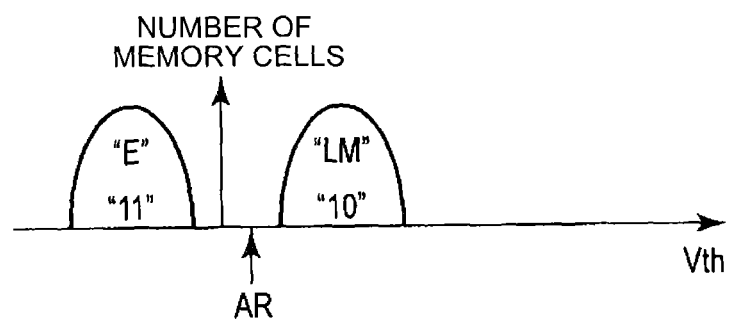
FIG. 11 is a conceptual diagram showing a relationship between data in the memory cell transistor and a distribution of threshold voltages according to the second embodiment.

The flag area 12 is positioned in back of the data area 11, for example, is included in a management area other than the data area in the page. The flag area 12 is positioned in back of LM flag as described in a third embodiment, for example. The flag area 12 includes an erasure judge flag (bit) for the ensure block search. The erasure judge flag is corresponded to one bit. A plurality of erasure judge flags, eight for example, is included in the flag area 12. This is because reliability of the flag is improved. Each of bits retains "11" or "10", for example, as shown in FIG. 11. FIG. 11 is an example showing threshold voltages of a transistor for the ensure search flag according to the second embodiment. When data is written in the page including the flag area 12, the flag area 12 is transferred into "10" state. Flag "10" represents that the corresponded inspection page, furthermore, the block included the corresponded inspection page have been already written, which is non-effective. On the other hand, Flag"11" represents that the corresponded inspection page, furthermore, the block included the corresponded inspection page have been already erased, which is effective. As the erasure judge flag represents "11" or "10", a voltage level AR is used in the judge of the bit.

Figure 12:
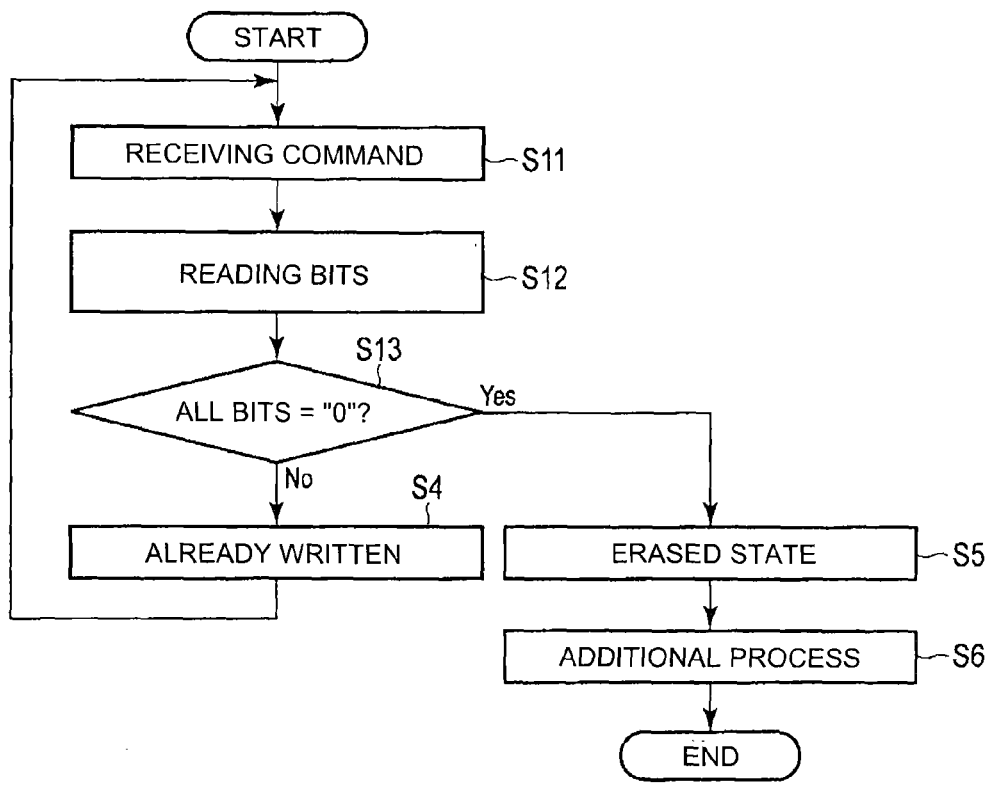
FIG. 12 is flow steps showing searching an erasure block according to the second embodiment.

FIG. 12 is flow steps showing searching an erasure block according to the second embodiment. As shown in FIG. 12, the memory is received an erasure block search command (Step S11). The erasure block search command is similar to that of the first embodiment and the position of the bits specified is only different. In other word, the erasure block search command in the second embodiment specifies an address of the block or the inspection page to be searched and the bit of the flag area 12 in the inspection page (top page).

A controller 7 read out data as the same as the Step 2 S2 in the first embodiment (Step 12). The controller 7 responses to receiving the erasure block search command to pre-charge to only the bit line corresponded to the bits of the flag area in the inspection page of the block to be searched. Reading out data from the bit line BL is performed by using the same steps as the conventional data reading and the circuit and the voltage AR is utilized. The bits read-out is received by the controller 7. The controller 7 determines whether the bit is "1" or not, erasure state or not (Step S13). When the block to be searched is the erasure state, the controller 7 outputs a response to an outer device that the block searched by the erasure block search command is the erasure state. On the other hand, when the judge is NO in Step S13, the flow is transferred to Step S4, and when the judge is YES in Step S13, the flow is transferred to Step S5.

As described above, the erasure judge flag is defined in the inspection page. Only flag is read out to the erasure block search. A same number of the bit lines BL are only pre-charged corresponding to the read bits. As a result, electrical current pre-charged in all bit lines can be decreased to be ¹⁄₁₆K so that the erasure block can be searched by extremely smaller current when the memory capacity in one page is set to be 16 Kbyte.

Third Embodiment

A third embodiment is related to another specific flag of an ensure block search. A functional block of a semiconductor device according to the second embodiment is the same as the first embodiment. On the other hand, actions in some of functional blocks in the third embodiment are different from that in the first embodiment. Memories according to the third embodiment, especially corresponding functional blocks are configured to realize actions described below.

A flag called LM flag is defined in a memory enable to retain multi bits per one cell. A memory according to the third embodiment supports LM flag. LM flag demonstrates that a page including LM flag is written-in to an upper page. Meanwhile, the page is constituted with a pair of memory cells MT connected to the same bit line. Various kinds of configurations are allowed to realize such the flag. In such the case, LM flag and an erasure judge flag can be defined not to interfere with a relationship between LM flag and the erasure judge flag. One example is described such a configuration below.

An exemplary memory cell transistor for LM flag is set to be E state or B state. B state indicates a flag is effective, namely, data is written-in to an upper page. Such LM flag as an example can be realized as one set of two flags. In this case, a first flag is set to be E state or A state. A state indicates a flag is effective, namely, data is written-in to the upper page. A second flag is set to be E state or B state mentioned above. The first flag and the second flag are called top LM flag and bottom LM flag, respectively. It is a condition to be judged as effective that both the flags are effective. In other word, it is judged that the corresponding page is written-in to the upper page when both the flags are effective. LM flag can include a plurality of bits with a same value each other. Each pair of two kinds of LM flags includes eight bits.

Figure 13:
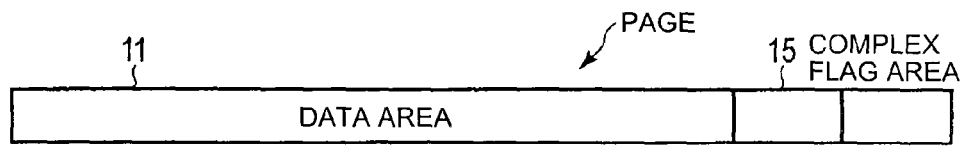
FIG. 13 is a conceptual diagram showing searching an erasure block according to a third embodiment.

The bottom LM flag is unified with the erasure judge flag in the two kinds of the flags. In other words, the second flag is utilized in the third embodiment. A flag not to interfere with the bottom LM flag as the erasure judge flag, for example, a flag expressing information at E state or A state is selected. The erasure judge flag is set to be E state or A state, and A state indicates that the flag is non-effective, namely, data has already written into the corresponding page. The erasure judge flag can be realized due to the combination described above by using the conventional bottom LM flag. In other word, as the complex flag having both bottom LM flag and the erasure judge flag is set to be E state or B state. Bottom LM flag is realized by a determination whether the memory transistor is E state or A state to generate the erasure judge flag. As shown in FIG. 13, a complex flag area 15 is positioned in back of a data area 11, for example. FIG. 13 shows an example of formatting a page in the semiconductor devices according to the third embodiment. Top LM flag is adjacently positioned in back or front of the complex area 15, for example. The complex flag 15 can be constituted with one bit or a plurality of bits having the same value, sixteen bits for example. The complex flag 15 can be set at least in an inspection page (top page) for the erasure block search. It is arbitrarily whether or not the complex flag 15 is set to be in another page of the same block.

Figure 14:
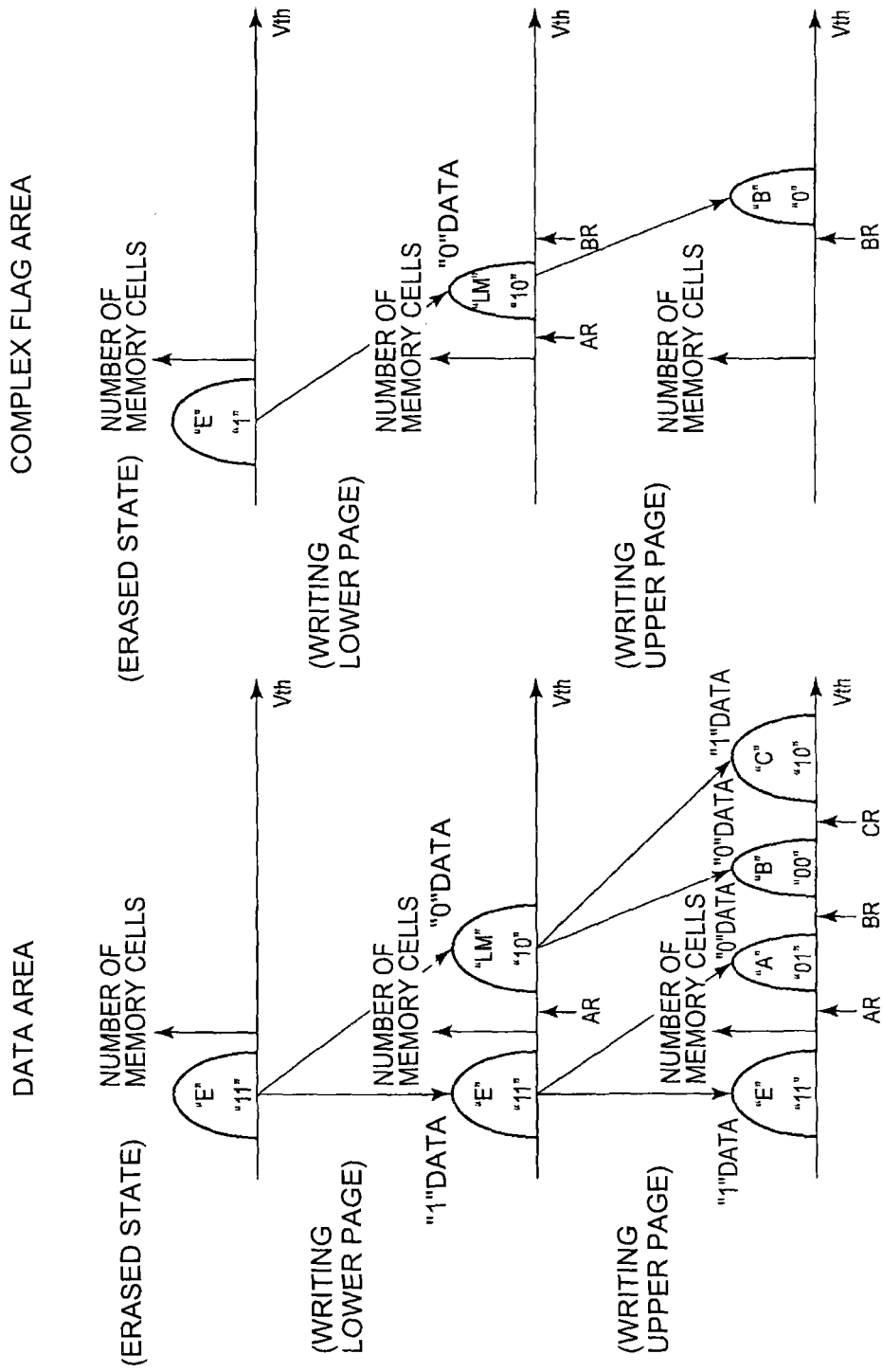
FIG. 14 is a conceptual diagram showing a relationship between data in the memory cell transistor and a distribution of threshold voltages according to the third embodiment.

Furthermore, the complex flag is explained as reference to FIG. 14. FIG. 14 is a conceptual diagram showing various kinds of a memory transistor for a complex flag according to the third embodiment. FIG. 14 also shows a state of the memory transistor in the data area 11 including the complex flag. As shown in an upper portion of FIG. 14, a memory cell transistor MT in the data area 11 (called data transistor hereinafter) and a memory cell transistor MT for the complex flag (called complex flag transistor hereinafter) are set to be E state. In the memory, the erasure block can be found to find the complex flag transistor of E state by using a voltage AR.

Next, the data transistor is retained as E state or is transferred to LM state on a basis of written-in data at a lower page in a middle portion of FIG. 14. In addition, the complex flag transistor is transferred to A state. Such a transition is contrasted to be transferred to LM state in the bottom LM flag. The complex flag transistor is transferred to A state in a situation that the data transistor is transferred to LM state. Therefore, it is necessary that both the transition to LM state of the data transistor and the transition to A state of the complex flag transistor are concurrently attained in the writing into the same page. Accordingly, a number of repeating to the complex flag transistors are set as an upper limitation, for example. A number of repeating voltage application to the complex flag transistor for transition of a threshold voltage is limited less than a number of repeating voltage application to the data transistor. In such a manner, the voltage is successively applied to the data transistor after reaching the upper limitation. On the other hand, the threshold voltage of the complex flag transistor is suppressed below the voltage BR. In verification of the writing-in, the data transistor is different from the complex flag transistor.

Distributions of threshold voltages of the data transistor and the complex flag transistor corresponded each other are demonstrated at the writing lower page in the middle portion. It is determined that the flag is non-effective when the complex flag transistor is read out by the voltage AR for erasure block search. In other word, the inspection page has already written-in, therefore, it is determined that the block including the page is a written-in data state. Further, it is determined that the flag is non-effective, which is not written-in to the upper page, by reading out the complex flag transistor using the voltage BR. In such a manner, two kinds of the flags are not interfered each other.

As shown in a lower portion of FIG. 14, the data transistor is retained as E state or transferred to A state, B state or C state on a basis of data to be written-in. The complex flag transistor is concurrently transferred to B state. When data is written-in to the upper page, the data transistor and the complex flag transistor have distributions of the threshold voltages as shown in the lower portion.

It is determined that the flag is effective, which is written-in to the upper page, by reading out the complex flag transistor using the voltage BR. When the complex flag transistor is read out using the voltage AR for the erasure block search, it is determined that the flag is non-effective. In this point, the judge is not changed in a case of written-in only to the lower page.

Flow steps of the erasure block search in the third embodiment are the same as that in the second embodiment. The threshold voltage of the complex flag transistor is determined by using the voltage AR. It is determined that the block including the inspection page to be searched is the erasure state in Step S2, when the voltage is below the voltage AR, which is the complex flag transistor is E state. On the other hand, it is determined that the block including the inspection page to be searched is the written-in state in Step S2, when the voltage is over the voltage AR, which is the complex flag transistor is A state. Data of the complex flag transistor is read out from the inspection page for erasure block search. Therefore, electrical current used as a pre-charge is less than that used as a pre-charge of all the bit lines.

The conventional flag which set to be E state or B state is described in the above case. However, another flag set to be E state or C state can be unified with the erasure judge flag. Further, two bits/cell is described as an example. However, the principle is the same in a case of over three bits. In other words, information of the erasure judge flag is unified with a state of the threshold voltage which is not used for the conventional flag in the states of the threshold voltages. Logic of the conventional flag and the erasure judge flag is defined without interference each other. Each of logics in two kinds of flags having E state is represented as an example. One of residual states represents the other logic of a first flag and the other of the residual states represents the other logic of a second flag. Meanwhile, it is determined that two kinds of flags may not use overlapping threshold voltage state.

As mentioned above, the erasure judge flag is defined in the inspection page according to the third embodiment as the same as the second embodiment. Accordingly, the third embodiment can obtain the same effect as the second embodiment. Further, the erasure judge flag can be realized using LM flag according to the third embodiment. LM flag can conventionally retain a plurality of bits/one cell in the memory. Accordingly, it is not necessary to generate new flag area for defining the erasure judge flag, so that the memory cell transistor can effectively utilized.

Other embodiments of the present disclosure will be apparent to those skilled in the art from consideration of the specification and practice of the disclosure disclosed herein. It is intended that the specification and example embodiments be considered as exemplary only, with a true scope and spirit of the disclosure being indicated by the claims that follow. The disclosure can be carried out by being variously modified within a range not deviated from the gist of the disclosure.

What is claimed is:

1. A semiconductor memory device comprising:
    a plurality of blocks in a memory cell, each of the blocks acting as an erasure unit of data, and including a plurality of pages, each of the pages including a plurality of memory cell transistors, each of the memory cell transistors being configured to be in an erasure state or in a first retention state based on a threshold voltage thereof; and
    a controller configured to search in each said block with respect to data, to write a first flag to denote effective into a prescribed page of the block with the prescribed page in the erasure state, to write the first flag to denote non-effective into the prescribed page of the block with the prescribed page in the first retention state, to read out the prescribed page of the block with the prescribed page in the first retention state, and to determine that the block is writable when the first flag denotes effective.

2. The semiconductor memory device of claim 1, wherein the controller receives a dedicated search command when the block is searched.

3. The semiconductor memory device of claim 1, wherein the prescribed page in the block is set to be in a top page in the block as an inspection page, the inspection page including an inspection memory cell transistor,
    the controller reads out the inspection memory cell transistor in the searching of the block, and
    the controller determines that the block is in the erasure state when the inspection memory cell transistor is in the erasure state, and determines that the block is in the first retention state when the inspection memory cell transistor is in the first retention state.

4. The semiconductor memory device of claim 3, wherein the inspection page includes a flag area including the first flag and the first flag is written into the inspection memory cell transistor.

5. The semiconductor memory device of claim 4, wherein the memory cell transistor is constituted to retain one bit or two bits.

6. The semiconductor memory device of claim 5, wherein the memory cell transistor is constituted to retain two bits and a second flag as well as the first flag is written into the flag area.

7. The semiconductor memory device of claim 6, wherein the second flag is written into the inspection memory cell transistor in the flag area.

8. The semiconductor memory device of claim 7, wherein both the first flag and the second flag are written into the same inspection memory cell transistor.

9. The semiconductor memory device of claim 6, wherein the memory cell transistor retains data as one of the erasure state, the first retention state, a second retention state or a third retention state, the inspection memory cell transistor represents the first flag via the first retention state or the second retention state and the second flag via the erasure state or the second retention state, and data in the block is erased in the erasure state.

10. The semiconductor memory device of claim 6, wherein a number of bit lines being applied with voltage in the inspection memory cell transistors are less than a number of bit lines being applied with voltage in the memory cell transistors other than the inspection memory cell transistors when the controller writes data into the inspection page including the inspection memory cell transistors.

11. A method for writing in a semiconductor memory device comprising:
receiving a search command in a controller to search a block of an erasure state with respect to data;
searching the block of the erasure state using the controller;
determining whether or not the block is in the erasure state or in a first retention state using the controller;
using the controller, writing a first flag to denote effective into a prescribed page of the block with the prescribed page in the erasure state, and writing the first flag to denote non-effective into the prescribed page of the block with the prescribed page in the first retention state; and
reading out data, using the controller, from the block, and outputting information in which the block is in the erasure state when the block is in the erasure state.

12. The method of claim 11, wherein the controller repeatedly performs searching of another block when the block is in the first retention state and determines whether the another block is in the erasure state or in the first retention state.

13. The method of claim 11, wherein
the prescribed page in the block is set to be in a top page as an inspection page, the inspection page including an inspection memory cell transistor, and the controller reads out data from a memory cell transistor, and in the searching of the block, and
the controller determines that the block is in an erasure state when the inspection memory cell transistor is set to be the in erasure state, and determines that the block is in a first retention state when the inspection memory cell transistor is set to be in the first retention state.

14. The method of claim 13, wherein the inspection page includes a flag area including the first flag, the first flag is written into the inspection memory cell transistor.

15. The method of claim 14, wherein the memory cell transistor is constituted to retain one bit or two bits.

16. The method of claim 15, wherein the memory cell transistor is constituted to retain two bits and a second flag as well as the first flag is written into the flag area.

17. The method of claim 16, wherein the second flag is written into the inspection memory cell transistor in the flag area.

18. The method of claim 17, wherein both the first flag and the second flag are written into the same inspection memory cell transistor.

19. The method of claim 16, wherein the memory cell transistor retains data as one of the erasure state, the first retention state, a second retention state or a third retention state, and the inspection memory cell transistor represents the first flag via the first retention state or the second retention state and the second flag via the erasure state or the second retention state.

20. The method of claim 16, wherein an upper limitation number of applying voltages to the inspection memory cell transistors is less than an upper limitation number of applying voltages to the memory cell transistors other than the inspection memory cell transistors when the controller writes data into the inspection page including the inspection memory cell transistors.

* * * * *